(12) United States Patent
Cheng et al.

(10) Patent No.: US 11,384,425 B2
(45) Date of Patent: Jul. 12, 2022

(54) METHOD OF ENHANCING ELECTRICAL CONDUCTION IN GALLIUM-DOPED ZINC OXIDE FILMS AND FILMS MADE THEREFROM

(71) Applicant: Purdue Research Foundation, West Lafayette, IN (US)

(72) Inventors: Gary J. Cheng, West Lafayette, IN (US); Qiong Nian, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 16/033,669

(22) Filed: Jul. 12, 2018

(65) Prior Publication Data

US 2019/0017164 A1    Jan. 17, 2019

Related U.S. Application Data

(60) Provisional application No. 62/532,186, filed on Jul. 13, 2017.

(51) Int. Cl.
  *C23C 14/28* (2006.01)
  *C23C 14/58* (2006.01)
  (Continued)

(52) U.S. Cl.
  CPC ........ *C23C 14/5813* (2013.01); *C23C 14/086* (2013.01); *C23C 14/28* (2013.01); *H01B 5/14* (2013.01)

(58) Field of Classification Search
  CPC .................. C30B 1/02; H01L 21/02667; H01L 21/02675–02691
  See application file for complete search history.

(56) References Cited

U.S. PATENT DOCUMENTS

2001/0010702 A1\* 8/2001 Tanaka .................. B23K 26/067
                                                                372/99
2014/0346500 A1\* 11/2014 Yamazaki ............... C23C 14/35
                                                                257/43

(Continued)

FOREIGN PATENT DOCUMENTS

WO    WO-2013094403 A1 \*  6/2013  ........... C23C 14/086

OTHER PUBLICATIONS

Chen et al, "Highly transparent conductive Ga doped ZnO films in the near-infrared wavelength range", J Mater Sci: Mater Electron, 2016, vol. 27, p. 9291-9296 (Year: 2016).\*

(Continued)

*Primary Examiner* — Z. Jim Yang
(74) *Attorney, Agent, or Firm* — Purdue Research Foundation

(57) ABSTRACT

A method of producing gallium-doped zinc oxide films with enhanced conductivity. The method includes depositing a gallium-doped zinc oxide film on a substrate using a pulsed laser and subjecting the deposited gallium-dope zinc oxide film to a post-treatment effecting recrystallization in the deposited film, wherein the recrystallization enhances the conductivity of the film. Another method of producing gallium-doped zinc oxide films with enhanced conductivity. The method includes the steps of depositing a gallium-doped zinc oxide film on a substrate using a pulsed laser and subjecting the deposited gallium-dope zinc oxide film to an ultraviolet laser beam resulting in recrystallization in the film, wherein the recrystallization enhances the conductivity of the film. A film comprising gallium-doped zinc oxide wherein the film contains a recrystallized grain structure on its surface.

4 Claims, 13 Drawing Sheets

(51) Int. Cl.
*C23C 14/08* (2006.01)
*H01B 5/14* (2006.01)

(56) References Cited

U.S. PATENT DOCUMENTS

| | | | |
|---|---|---|---|
| 2015/0076504 A1* | 3/2015 | Im | H01L 29/04 |
| | | | 438/795 |
| 2015/0179446 A1* | 6/2015 | Lee | H01L 29/66969 |
| | | | 438/104 |
| 2017/0092772 A1* | 3/2017 | Seo | H01L 29/78696 |
| 2017/0291848 A1* | 10/2017 | Canova | C23C 14/5806 |
| 2019/0181009 A1* | 6/2019 | Rumsby | H01L 27/1285 |

OTHER PUBLICATIONS

Q. Nian, M.Y. Zhang, B.D. Schwartz, G.J. Cheng, Ultraviolet laser crystallized ZnO: Al films on sapphire with high Hall mobility for simultaneous enhancement of conductivity and transparency. Appl. Phys. Lett. 104, 201907 (2014) (Year: 2014).*

* cited by examiner

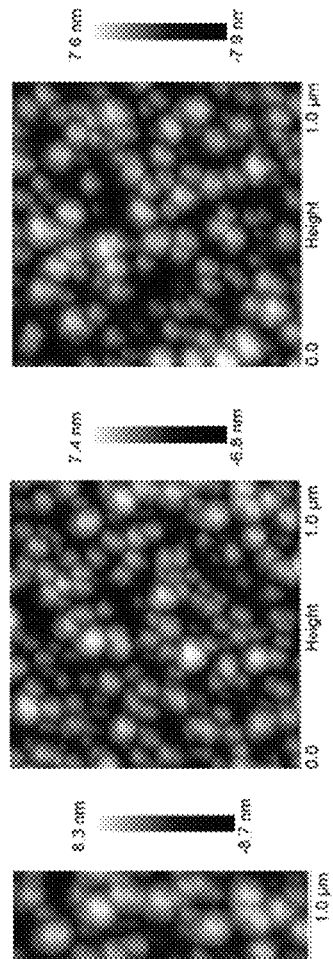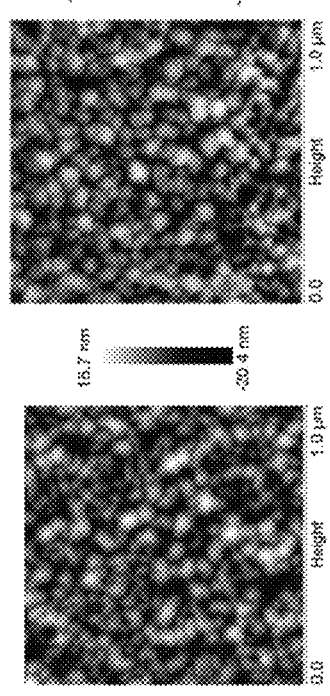
FIGS. 3A through 3H

METHOD OF ENHANCING ELECTRICAL CONDUCTION IN GALLIUM-DOPED ZINC OXIDE FILMS AND FILMS MADE THEREFROM

CROSS REFERENCE TO RELATED APPLICATIONS

The present U.S. patent application is related to and claims the priority benefit of U.S. Provisional Patent Application Ser. No. 62/532,186 filed Jul. 13, 2017, the contents of which are hereby incorporated by reference in their entirety into the present disclosure.

TECHNICAL FIELD

This disclosure relates to methods of improving the electrical conductivity of gallium-doped zinc oxide (GZO) films, especially transparent GZO films.

BACKGROUND

This section introduces aspects that may help facilitate a better understanding of the disclosure. Accordingly, these statements are to be read in this light and are not to be understood as admissions about what is or is not prior art.

Transparent conducting oxide (TCO) films, achieving both electrical conduction and optical transparency, are critical in many large consumer optoelectronic devices such as flat panel displays, photovoltaic cells, light emitting diodes and electrochromic windows. Generally, these major applications require TCO exhibiting electrical resistivity less than $10^{-3}$ $\Omega \cdot cm$ while transparency is more than 80% in visible (Vis) and near-infrared region (NIR). Until recently, over 90% mainstream market of TCOs were dominated by indium tin oxide (ITO), whose resistivity approaches $10^{-4}$ $\Omega \cdot cm$. However, due to the toxicity, scarcity and escalating cost of indium, there are urgent needs to seek alternative TCO films.

Zinc oxides (ZnO) have drawn considerable attention for the last three decades as a promising substitute for ITO, since it is non-toxic, abundant and inexpensive. And as an II-VI wide band gap (3.34 eV) semiconductor, ZnO exhibits high Vis and NIR transparency. However, pure ZnO has high resistivity, which could be decreased by controllable n-type doping with group III elements. And also un-doped ZnO thin films also show instable electrical properties, resulting from the chemisorption of oxygen at the surface and grain boundaries, which leads to higher resistivity. The properties of the films can be stabilized by extrinsic dopants. Among n-type dopant group III elements, aluminum (Al) and Gallium (Ga) were the most widely used. Ga dopant attracts more attention due to Ga—O has similar ionic (0.62 vs. 0.74 A) and covalent radii (1.26 vs. 1.25 A) as compared to Zn—O, meaning a highly Ga doped ZnO could be achieved without substantial lattice deformation.

Ga doped ZnO (GZO) is currently under investigation and development to replace ITO as a transparent conductive coating. To manufacture a GZO film, usually physical vapor deposition (PVD) was utilized to pursue high electron conductivity. Various deposition techniques are applied to prepare GZO films, such as sputtering, ion beam assisted deposition (IBAD), atomic layer deposition (ALD) and pulsed laser deposition (PLD), most of them mainly operating under vacuum. On the other hand, there are some reports of depositing GZO by low temperature PVD for optical devices or solution based sol-gel fabrication, but poor optoelectronic properties were obtained. The electrical conductivity of GZO film could not exceed $4 \times 10^{-4}$ $\Omega \cdot m$, especially for low thickness (<200 nm) films with high optical transparency.

Hence there is an unmet need to improve the electrical conductivity of GZO films deposited, so that GZO films can compete with ITO films in terms of conductivity.

SUMMARY

A method of producing gallium-doped zinc oxide films with enhanced conductivity is disclosed. The method includes the steps of depositing a gallium-doped zinc oxide film on a substrate using a pulsed laser deposition technique, and subjecting the deposited gallium-dope zinc oxide film to a post-treatment capable of resulting in recrystallization in the deposited gallium-doped zinc oxide film, wherein the recrystallization results in a gallium-doped zinc oxide film with a conductivity higher than the conductivity of the gallium-doped zinc oxide film deposited on the substrate pulsed laser deposition technique. Examples of substrates suitable for the method of this disclosure include but not limited to quartz, silicon, and sapphire.

Another method of producing gallium-doped zinc oxide films with enhanced conductivity is disclosed. The method includes the steps of depositing a gallium-doped zinc oxide film on a substrate using a pulsed laser deposition technique; and subjecting the deposited gallium-dope zinc oxide film to a ultraviolet laser beam resulting in recrystallization in the deposited gallium-doped zinc oxide film, wherein the recrystallization results in a gallium-doped zinc oxide film with a conductivity higher than the conductivity of the gallium-doped zinc oxide film deposited on the substrate using the pulsed laser deposition technique.

A film comprising gallium-doped zinc oxide wherein the film contains a recrystallized grain structure on its surface is disclosed.

BRIEF DESCRIPTION OF DRAWINGS

Some of the figures shown herein may include dimensions. Further, some of the figures shown herein may have been created from scaled drawings or from photographs that are scalable. It is understood that such dimensions or the relative scaling within a figure are by way of example, and not to be construed as limiting.

FIGS. 3A through 3H show atomic force microscope (AFM) images of grain morphology and surface roughness of GZO film after laser crystallization.

DETAILED DESCRIPTION

Figure 1:
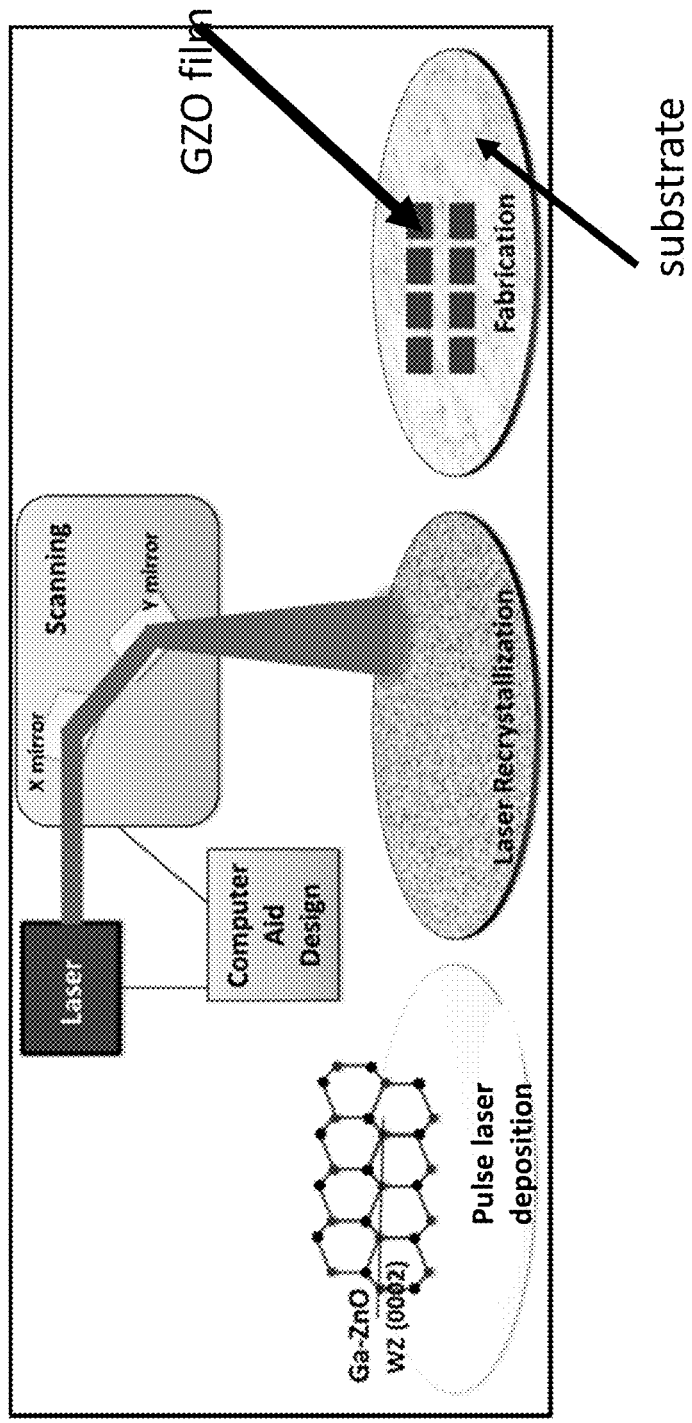
FIG. 1 is a schematic representation of the UV laser recrystallization of deposited GZO films as a post treatment according to this disclosure.

For the purposes of promoting an understanding of the principles of the disclosure, reference will now be made to the embodiments illustrated in the drawings and specific language will be used to describe the same. It will nevertheless be understood that no limitation of the scope of the disclosure is thereby intended.

In this disclosure, a post-treatment of GZO films produced by PLD methods is described as a means to enhance the electrical conductivity of the deposited GO films. In experiments leading to this disclosure, Ultra Violet (UV) laser crystallization was employed as a post treatment method GZO films produced by PLD methods.

FIG. 1 is a schematic representation of the UV laser recrystallization of deposited GZO films as a post treatment according to this disclosure. Referring to FIG. 1, pulsed laser deposition was used to coat Wurtzite structure Zinc Oxide film onto a glass substrate, with gallium dopant integrated in one source. After pulsed laser deposition, a pulsed UV Laser was scanning on the GZO film with shaped square beam and top-hat profile with size of 8×8 mm and enabled translations along both X and Y axis to boost the process efficiency. As shown, the laser generation, intensity, scanning path and beam size could be integrated into computer aided design program for potential digital manufacturing. After UV laser crystallization, the treated film could be characterized for quality analysis, device fabrication and practical application. During UV laser scanning, each UV laser pulse was able to introduce a localized high temperature field from photo energy absorption, because the band gap of GZO film (~3.6 eV) is lower than the photo energy of Excimer Laser (5 eV). This UV laser pulse induced heat treatment would lead to microstructure change and physical property improvement afterwards as described in this disclosure.

Laser crystallization experiments were carried out on room temperature pulsed laser deposition (PLD) samples. Before deposition, a 50.4 mm diameter, 0.33 mm thick, (0001) orientation sapphire substrate was cleaned by acetone, methanol, and DI water in an ultrasonic cleaner for 5 minutes each, sequentially. Then the sapphire substrate was put into a high vacuum chamber with a base pressure of 4.0×10$^{-6}$ Torr. In this chamber ZnO (99.99%) and 2% Ga2O3-doped zinc oxide (AZO) targets with 50 mm diameters were ablated by a KrF excimer laser (λ of 248 nm with τ of 25 ns). The target-substrate distance was fixed at 80 mm. Targets and substrates rotated at 7 and 5 RPM, respectively. A 50 nm thick i-ZnO film ('i' means intrinsic, undoped) was deposited on the sapphire substrate at a laser fluence of 1.5 J/cm2, repetition rate (RR) of 10 Hz for 20 minutes, and then 200 nm thick Al—ZnO was deposited at laser fluence of 0.5 J/cm2, RR of 5 Hz for 90 minutes. Finally a 250 nm thick AZO film was deposited at laser fluence of 0.5 J/cm2, RR of 5 Hz for 90 minutes. Oxygen pressure was set to be 150 and 1 mTorr for i-ZnO and GZO films, respectively.

After PLD, the sample was transferred into a 10 mTorr vacuum chamber for the UV laser crystallization process. The same excimer laser was used with RR of 10 Hz. The laser beam was shaped to a square, top-hat profile (8×8 mm). The sample was placed on a motorized stage which enables translations along both X and Y-axes as shown in FIG. 1. Laser intensities used in the crystallization experiments ranged from 120 to 200 mJ/cm2. The laser pulse number (N) used ranged from 10 to 200. After the laser crystallization, field emission scanning electron microscopy (FE-SEM) was used to measure the thickness of the AZO film via cross-section; top FE-SEM imaging was used to observe the surface structure. X-ray diffraction (XRD) was used to determine the AZO film's crystallinity and internal stress. Electrical resistivity and carrier mobility and concentration were measured by the Hall Effect with the Van der Pauw method. Optical transmittance spectra were measured by Lambda 950 ultraviolet-visible and infrared spectrophotometers.

Figure 2A:
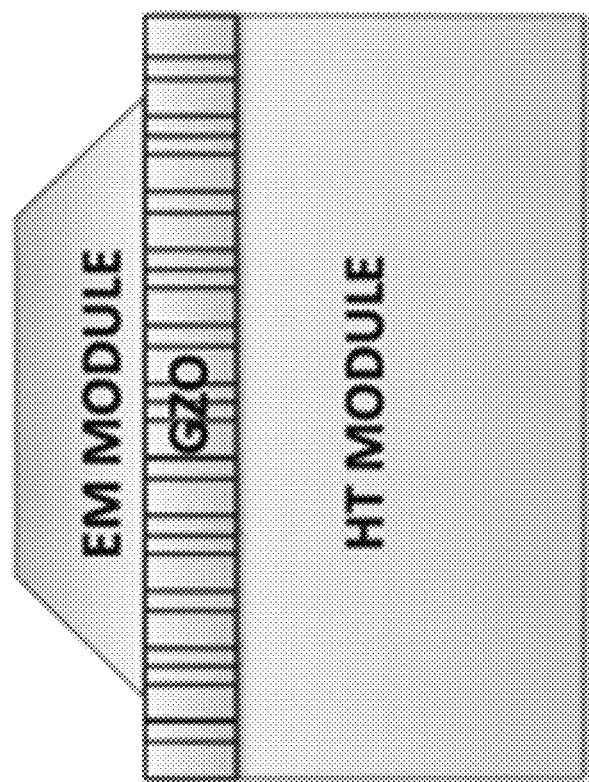
FIG. 2A shows the COMSOL Multiphysics® simulation set up, with EM module to simulate laser-mater interaction and HT module to simulate heat transfer occurs in GZO film and substrate.

In order to understand the laser heating process, COMSOL Multiphysics® was applied to simulate the laser energy absorption. {Gary: what does COMSOL stand for?} FIG. 2A shows the COMSOL Multiphysics® simulation set up, with EM module to simulate laser-mater interaction and HT module to simulate heat transfer occurs in GZO film and substrate. The electromagnetic module (EM) was used to simulate Laser irradiation, and the heat transfer module (HT) was used to describe the temperature increase in GZO polycrystalline film during a single laser pulse delivery. Laser beam is assumed to be in the fundamental mode with wavelength of 248 nm for crystallization process. Primary controlling parameters are laser pulse energy (E), pulse duration (τ), and beam radium (γ). The spatial distribution of laser pulse could be written as equation (1):

$$E = E_o \cdot \exp\left[-2\left(\frac{x^2}{r^2} + \frac{y^2}{r^2}\right)\right]$$

In this equation, $E_o$ represents the central pulsed energy of laser beam, and x, y are coordinates. Temporal distribution of the laser is represented by normalized Weibull function, which could manipulate the pulse duration and power by modifying its shape factors. The incident laser heating was induced by near-field scattering occurring on polycrystalline GZO structure, which can be depicts by resistive heating ($Q_{RH}$), which could be expressed in equation (2):

$$Q_{RH} = \tfrac{1}{2} Re\{\sigma EE^* - j\omega ED^*\}$$

The governing equations in the EM module in this study are Ampere's law with Maxwell's Correction and Faraday's law of induction as shown in equation (3):

$$\int J \cdot E dV + \oint (E \times H) \cdot nds = -\oint \left(E\frac{\partial D}{\partial t} + H\frac{\partial B}{\partial t}\right) dV$$

Due to the conservation of energy for the electromagnetic filed, where the first term and second term on left hand side represent the resistive losses and radiative losses, respectively. During resistive heating, as heat transfer occurs, temperature (T) would form in the system. A typical T field is given by solving a coupled HT module with $Q_{RH}$ as the heating source. The heat transfer equation is governed by equation (4):

$$Q_{RH} = \rho(X,T)c_\rho(X,T)\frac{\partial T(X,t)}{\partial t} - \nabla[\kappa(X,T)\nabla T(X,T)] + \rho(X,T)c_\rho(X,T)v_s\nabla T(x,t)$$

Figure 2B:
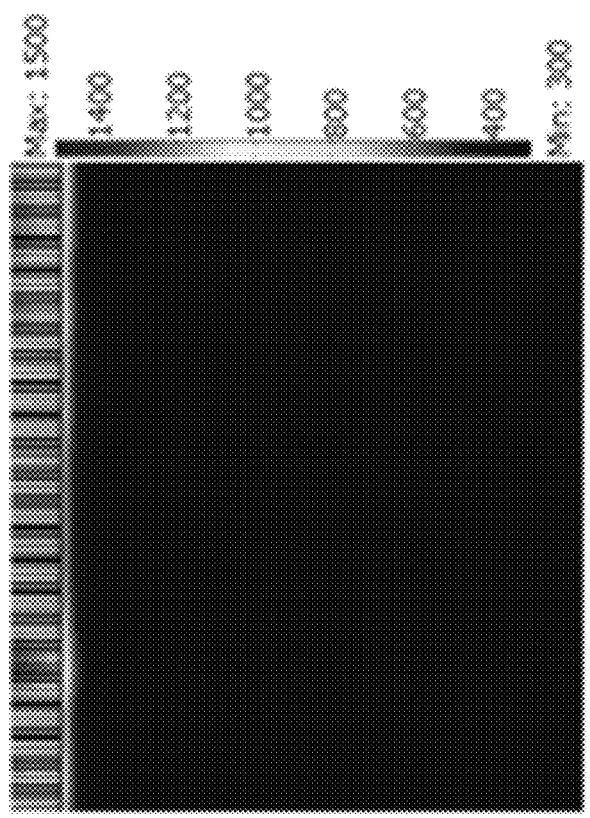
FIG. 2B shows results of simulation demonstrating that laser selective heating occurs at 45 ns simulation time, in which thermal energy was mainly absorbed by GZO film rather than glass substrate due to high absorption coefficient.

Equation (2), (3) and (4) are then numerically solved in coupled EM module and HT module as shown in FIG. 2A. Laser parameters, materials properties and film properties are set as essential input in the simulation. FIG. 2B shows results of simulation demonstrating that laser selective heating occurs at 45 ns simulation time, in which thermal energy was mainly absorbed by GZO film rather than glass substrate due to high absorption coefficient. Referring to FIG. 2B, heat energy was mainly absorbed by the GZO layer due to higher absorption coefficient comparing to glass substrate. FIG. 2B represents the temperature distribution at the simulation time of 45 ns, in which heat transfer into bottom glass substrate is still insufficient. The highest temperature in GZO film reaches 1500 K, while low temperature less than 600 K was observed in substrate. However, heat transfer occurs then due to temperature gradient in the GZO-substrate interface.

Figure 2C:
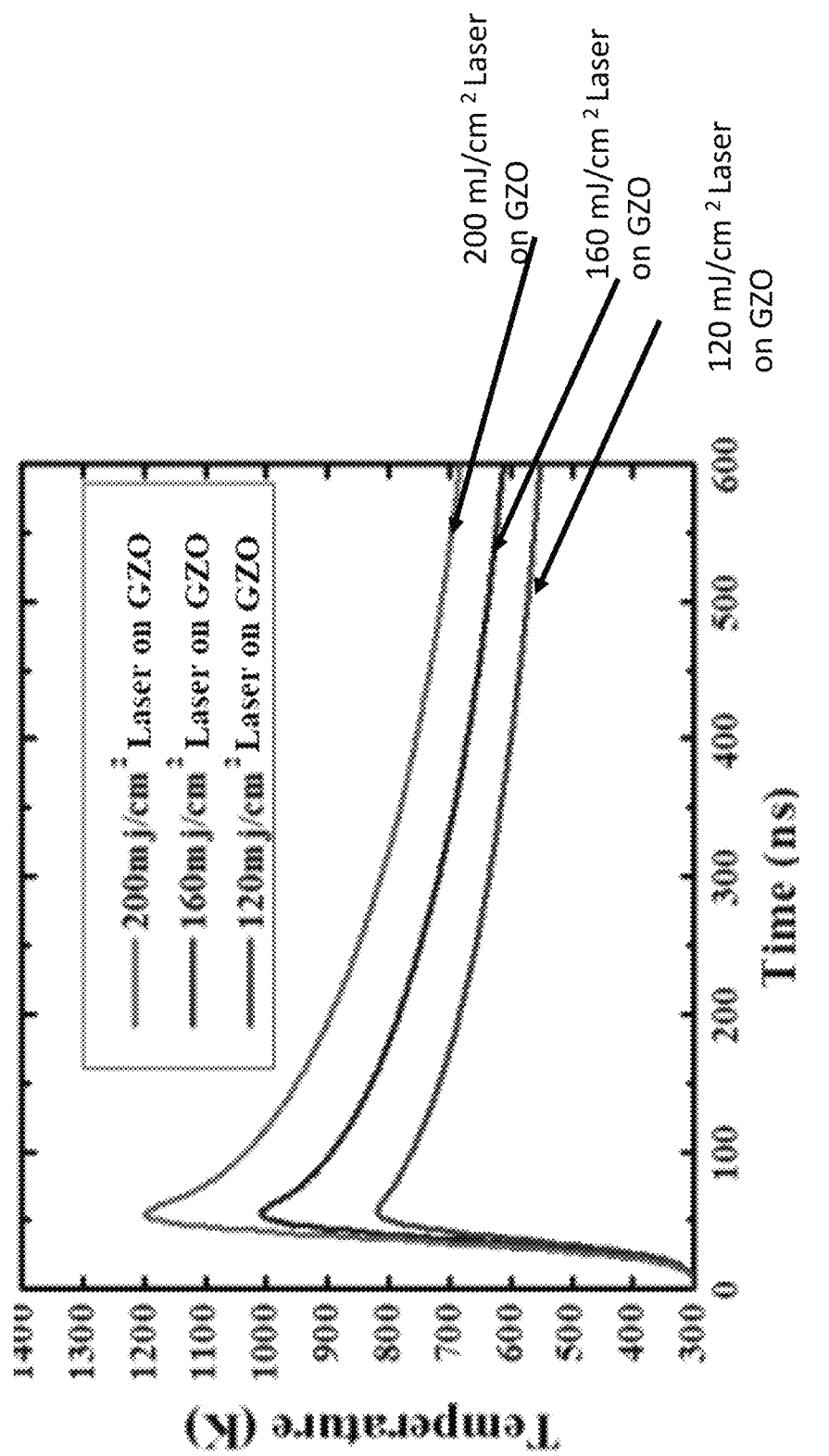
FIG. 2C shows temperature evolution of GZO film top surface during laser crystallization with single pulse delivery.
Figure 2D:
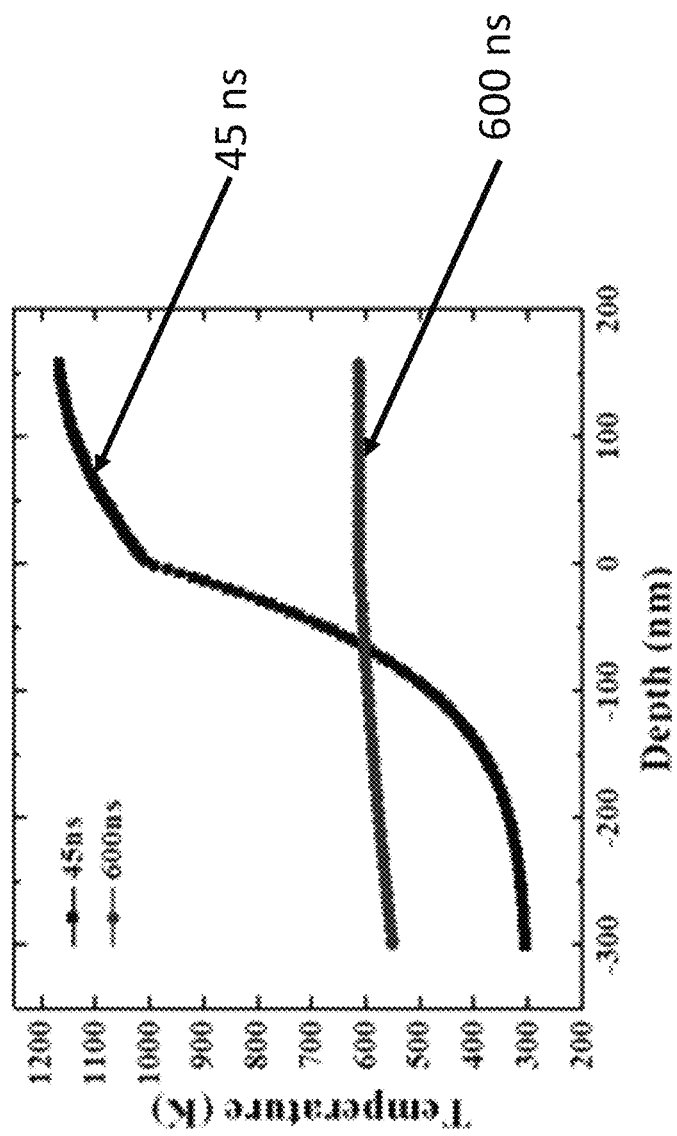
FIG. 2D shows temperature distribution along depth (160 nm GZO film to −300 nm substrate) at simulation time of 45 ns and 600 ns for single pulse delivery.
Figure 2E:
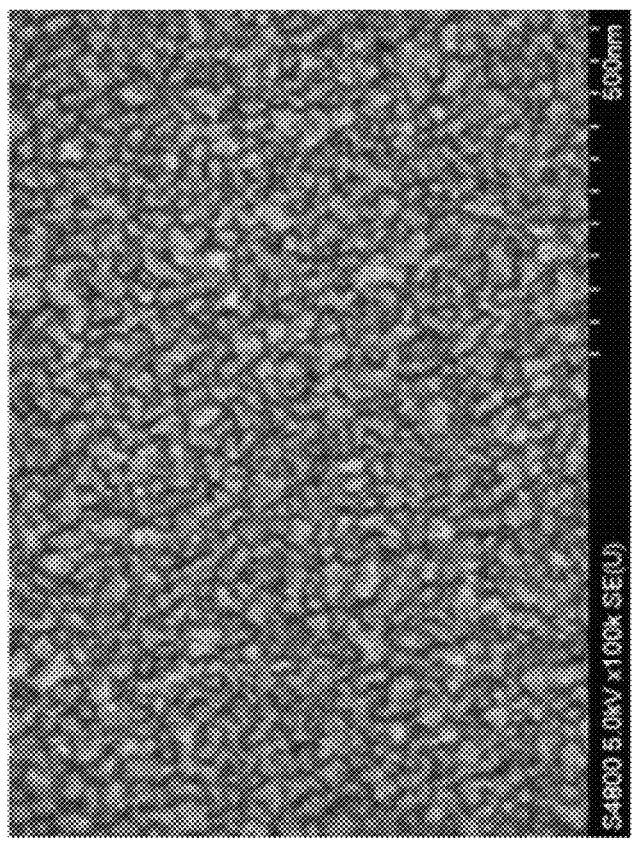
FIG. 2E shows SEM surface morphology of as-deposited GZO film.
Figure 2F:
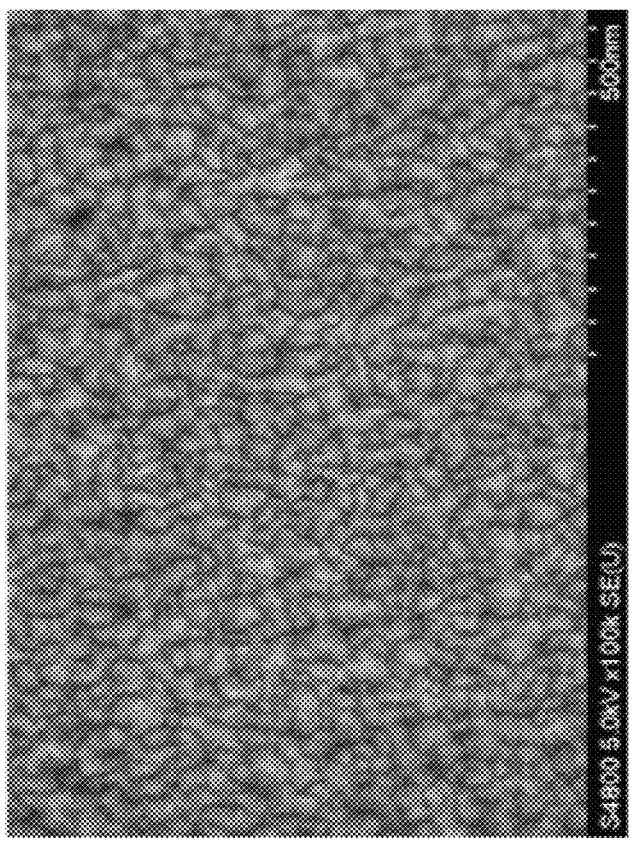
FIG. 2F shows SEM surface morphology of Laser crystallized GZO film.

FIG. 2C shows temperature evolution of GZO film top surface during laser crystallization with single pulse delivery. The result of one laser pulse irradiation and afterwards were represented in FIG. 2C. Referring to FIG. 2C, the temperature of GZO film increases to 800-1200K in 45 ns depending on laser intensity of 120-200 mJ cm$^{-2}$, respectively. Then the temperature of the GZO would be lowered by thermal dissipation, as demonstrated at 600 ns simulation time, before subsequent Laser pulse delivery. Then the temperature of the GZO would be lowered by thermal dissipation, as demonstrated at 600 ns simulation time, before subsequent Laser pulse delivery. This fast heating and following thermal dissipation also could be demonstrated by FIG. 2D, in which the temperature distribution over GZO film—substrate interface was recorded. Referring to FIG. 2D, in simulation time of 45 ns, thermal energy exchange from laser beam to GZO film governs. GZO film located from depth of 0 to 160 nm shows apparent elevated temperature (1000 to 1200K). However, when depth goes from 0 to −300 nm for substrate, a sharp decrease to room temperature (300K) was observed. This discontinuous circumstance renders the fact of laser induced selective heating. On the other side, thermal dissipation is able to transfer heat into substrate across interface drive by high temperature gradient. This is also demonstrated in FIG. 2D by simulation result in 600 ns in which both GZO film and substrate swing around 600K. This fast thermal dissipation indicates a fast cooling process of GZO film after initial selective laser heating. Therefore, multiple laser pulse shinning with repeatable heating-cooling process is able to drive microstructure change of target film, similarly to abnormal grain growth in solid recrystallization process. FIGS. 2E and 2F show the top view FESEM image of the Laser scanned film comparing to as deposited film, as thermal energy continues along multi laser pulse delivery (200 pulses in this image), the polycrystalline microstructure tends to reform large grains and faceted boundaries. Comparing untreated (FIG. 2E) to treated (FIG. 2F), it is found that the crystallized film is more compact and continuous, implying the crystallinity of the GZO film has been significantly enhanced.

FIGS. 3A through 3H show atomic force microscope (AFM) images of grain morphology and surface roughness of GZO film after laser crystallization. The grain structure before laser crystallization was shown as nanoparticles weak-linked together after PLD (FIGS. 3A and 3D. After laser crystallization under laser fluence of 105.6 mJ/cm$^2$, the grain boundary between the nanoparticles are much better connected with each other. With the laser pulse number (p) increases from 10p to 50p and 200p, the grain structure become denser. The roughness reduces significantly from 1.45 nm to 0.914 nm after 50p, which contribute to less optical scattering of the thin film. As laser fluence increases to 113.7 mJ/cm$^2$, the grain size increases more significantly than under 105.6 mJ/cm$^2$. Clear grain boundary can be seen after laser crystallization with 50p and 200p, while the grain structure is optimized with 50p.

Figure 4A:
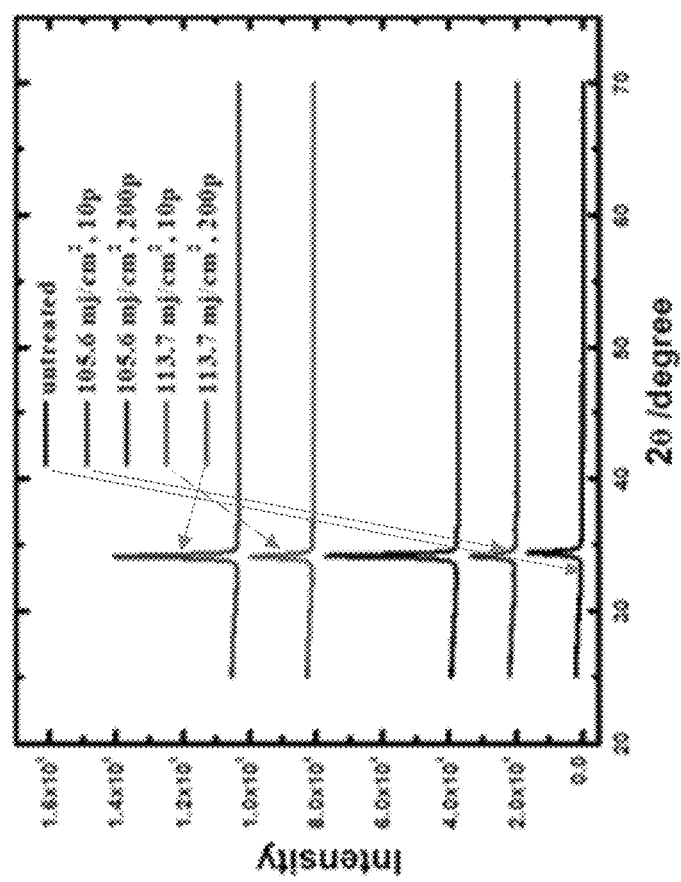
FIG. 4A shows θ-2θ XRD patterns of GZO films as-deposited by PLD and processed by Laser at 105.6 mJ/cm$^2$, 113.7 mJ/cm$^2$ with 10 pulses and 200 pulses, respectively.
Figure 4B:
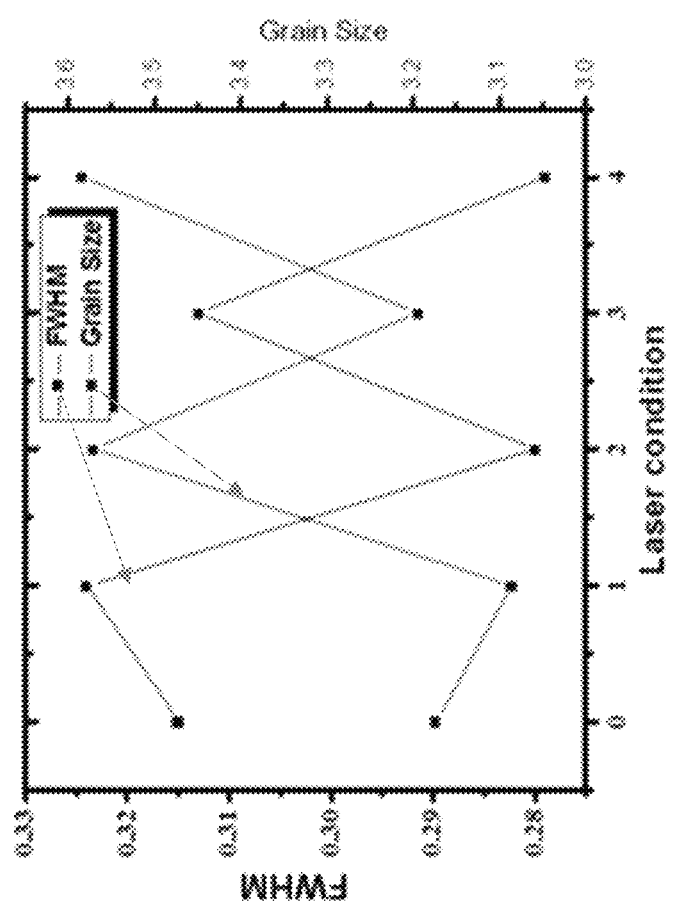
FIG. 4B shows FWHM and grain size characterization of GZO films as-deposited and processed by post laser crystallization.

FIG. 4A shows θ-2θ XRD patterns of GZO films as-deposited by PLD and processed by Laser at 105.6 mJ/cm$^2$, 113.7 mJ/cm$^2$ with 10 pulses and 200 pulses, respectively. The crystallinity modification of GZO film could be verified by X-Ray Diffraction Patterns (XRD) as shown in FIG. 4A. Typical peak located at 2θ=34.6° is well indexed to Wurtzite Zinc Oxide crystal planes of (002). Comparing to signals before laser crystallization, it is clear seen that (002) peak of GZO film achieve much higher intensity after multiple laser pulse delivery (200 pulses), implying enlarged grain size and textured crystal orientation. Further exploring of the structural modification on GZO film was characterized by calculating the Full Width Half Maximum (FWHM) and the grain size according to XRD peaks. The FWHM was measured by the Lorenz fit of the (002) peak, while grain size could be drawn from Bragg's Equation with FWHM as the input. FIG. 4B illustrates the FWHM and grain size of the GZO film as a function of laser processing conditions. Apparently with multiple laser pulse delivery for both laser intensity of 105.6 mJ/cm2 and 113.7 mJ/cm2, the FWHM show much narrower FWHM and grain show much larger size comparing to as-deposited film. These results are in good agreement with FIG. 3A through 3H in which large grain and faceted boundaries are formed combining with homogeneous and continuous surface.

Figure 4C:
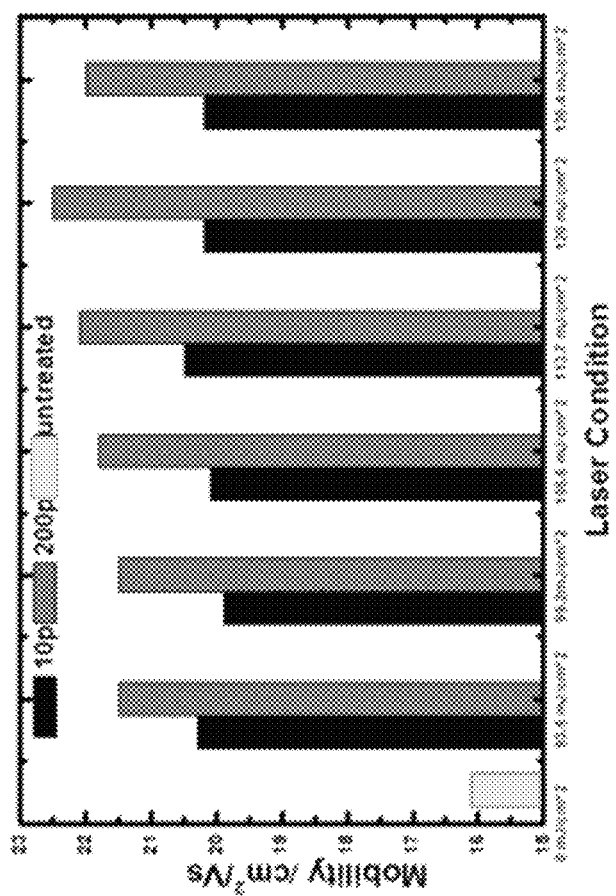
FIG. 4C shows laser parameter dependence of Hall measurements collected electron mobility.
Figure 4D:
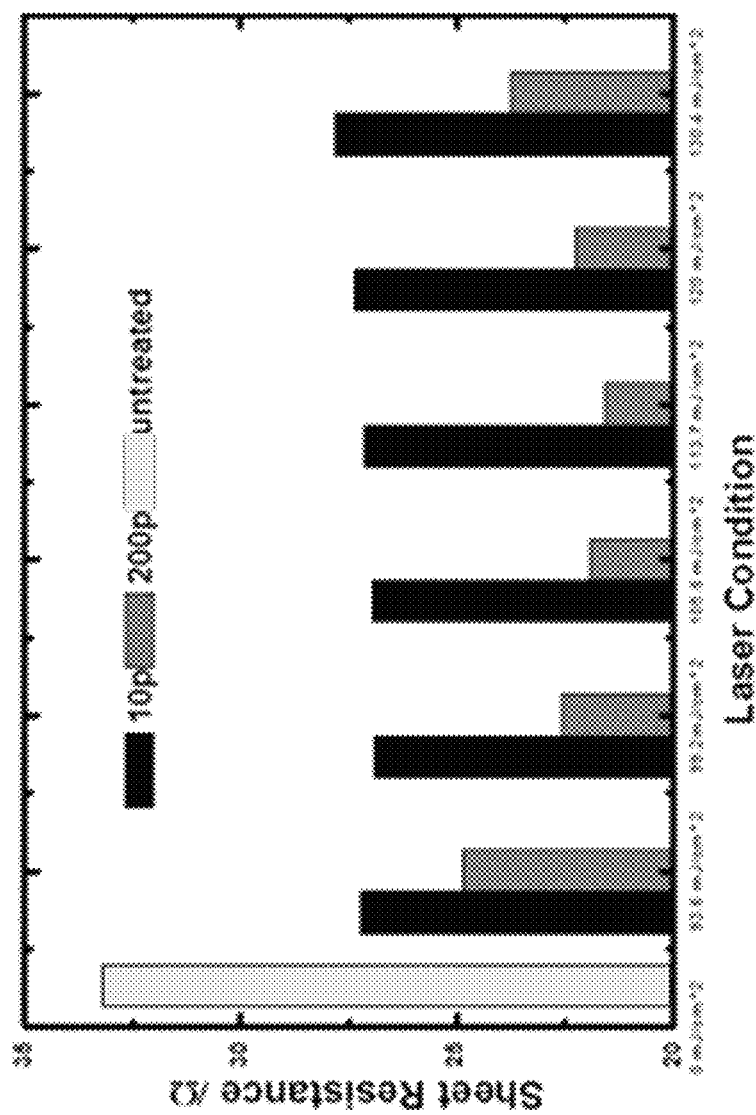
FIG. 4D shows laser parameter dependence of Hall measurements collected sheet resistance.

In order to assess the effects of crystallization on GZO film electrical performance, hall measurement was carried out. It is well known, with small size grain merged and larger size grain formed, it is straightforward to draw that grain boundary density was decreased. What's more, since the grain shape changed to facetted and surface compacted, the inter grain defects like voids, gaps and discontinuity decrease, which originally may create energy levels in the band gap that tend to trap the free electrons and decrease their lifetime. Both lower grain boundary density and less electron traps at boundaries are able to diminish the grain boundary barrier scattering and boost the electron mobility cross boundaries, which contribute to or dominate the polycrystalline GZO film mobility. FIGS. 4C and 4D show laser parameter dependence of Hall measurements collected electron mobility and sheet resistance respectively. As demonstrated in FIGS. 4C and 4D, the electrical properties of GZO films as a function of laser parameters, detected by Hall Effect Measurement was plotted. After the crystallization, a strong increase in mobility and decrease in sheet resistance are observed for all different Laser parameters as shown in FIGS. 4C and 4D. The as deposited GZO film performs a hall mobility of 16 cm2 V−1 s−1, on contrast, the hall mobility increases to ~20 cm2 V−1 s−1 with 10 laser pulses delivery and ~22 cm2 V−1 s−1 with 200 laser pulses delivery.

In order to delve into the mechanism of electron mobility improvement, the electron's mean free path l could be calculated using the following equation 5:

$$l = \frac{h}{2e}\left(\frac{3N}{\pi}\right)^{\frac{1}{3}}\mu$$

Where h is the Plank's constant, e is the electron charge, N is the carrier concentration and μ is the hall mobility. Inputting hall measurement values in table 1, the mean free path of the carriers for as-deposited GZO film could be calculated as 3.1 nm, which is in the same range of grain size shown in FIG. 4B. This indicates the electron mobility inside polycrystalline GZO film is mainly dominated by grain boundary scattering mechanism. To analyze the grain boundary scattering dominated mobility $\mu_g$ enhancement of GZO film after laser crystallization, the polycrystalline structure and energy level could be referred. The grain boundary density is determined by grain size L while the scattering intensity at grain boundaries is determined by energy potential barrier height $\Phi_b$. The latter one is controlled by electron trap density ($N_t$) and the free electron concentration ($N_{eff}$). Some researchers extended models in the literature on the basis of the first approximation to describe the energy potential barrier at grain boundary as shown in equation (6) below which $\varepsilon\varepsilon_0$ is the static dielectric constant, m* is the electron effective mass and e is the elementary charge.

$$\mu_g = \mu_0 \exp\left(-\frac{\phi_B}{kT}\right) = \frac{eL}{\sqrt{2\pi m * kT}} \exp\left(-\frac{e^2 N_t^2}{8kT\varepsilon\varepsilon_0 N_{eff}}\right)$$

The basic result of this equation is based on electrons transport through grain boundary by thermionic emission over the barrier, taking into account of electron traps as a depletion region formed on either side of the grain boundary barrier. Based on equation (6), the electron mobility inside GZO film is mainly dominated by grain size L and electro trap density at grain boundaries $N_t$. Thereby, after laser crystallization, the increased mobility by hall measurement could be used for reverse derivation. As derived with inputting of hall mobility of 20 and 22 cm$^2$ V$^{-1}$ s$^{-1}$ into equation (5), the mean free path of electrons should be 3.8 and 4.2 nm, respectively. This value is much higher comparing to the measured grain size in FIG. 4B (3.2 and 3.6 nm), implying the larger grain formation is not the only reason for electron mobility increase. Thus, there must be decrease of electron trap density $N_t$ contributing to electron mobility enhancement in GZO film after laser crystallization. The decrease of electron trap density attributes to both removal of extended defects (mid-band energy level) and desorption of oxygen species at grain boundaries. Desorption of oxygen species by UV Laser exposure would release free carriers from traps which is stated by prior report. Subject to current series of samples, this could be demonstrated by a moderate increase of carrier concentration after laser as shown in Table 1 below.

TABLE 1

Laser crystallization conditions on GZO films and the derived Hall measurement performance.

| laser intensity | pulses | $R_{sheet}$ (Ω/sq) | ρ (Ω · cm) | μ (cm$^2$/Vs) | $N_{eff}$ (cm$^3$) |
|---|---|---|---|---|---|
| 0 | 0p | 33.23 | 5.12 × 10$^{-4}$ | 16.1 | −7.56 × 10$^{20}$ |
| 105.6 mJ/cm$^2$ | 10p | 26.98 | 4.05 × 10$^{-4}$ | 20.1 | −7.66 × 10$^{20}$ |
| 105.6 mJ/cm$^2$ | 200p | 21.95 | 3.29 × 10$^{-4}$ | 21.8 | −8.70 × 10$^{20}$ |
| 113.7 mJ/cm$^2$ | 10p | 27.18 | 4.08 × 10$^{-4}$ | 20.5 | −7.46 × 10$^{20}$ |
| 113.7 mJ/cm$^2$ | 200p | 21.59 | 3.24 × 10$^{-4}$ | 22.1 | −8.73 × 10$^{20}$ |

The electron mobility increase would result in sheet resistance decreases from 33 Ω/sq to 21 Ω/sq, when multiple laser pulses were delivered to GZO film with optimal laser intensity. As demonstrated in FIG. 4D, the sheet resistance of GZO films varies as a function of laser parameter. Both higher laser intensity and multiple laser pulses would contribute to low sheet resistance. The optimal laser intensity and pulse number was observed as 113.7 mJ/cm$^2$ and 200 pulses. The optimal laser conditions could be varied according to different metal oxide and different substrate, however are straightforward to discover with a series of experiments. And it should be noted that, although conductivity enhancement associates with a strong increase in carrier mobility, a moderate increase in carrier concentration also should not be neglected. This moderate increase of carrier concentration inside GZO film not only reflects in sheet resistance decrease but also in optical transmittance change.

Figure 5:
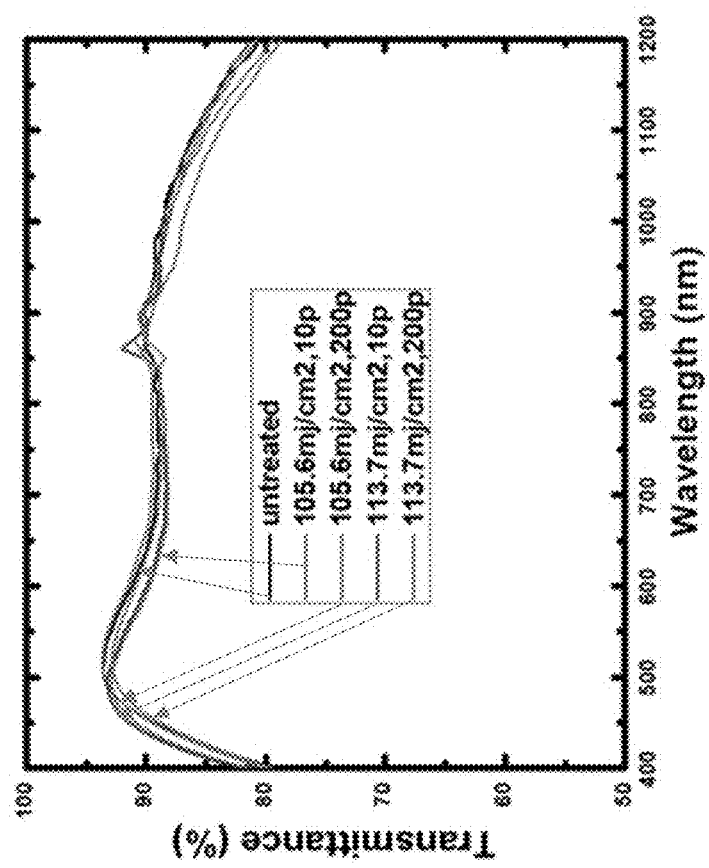
FIG. 5 shows influence of laser crystallization on transmittance.

FIG. 5 shows influence of laser crystallization on transmittance. Referring to FIG. 5, visible-IR transmittance spectrum (with glass substrate during measuring) processed GZO films encounter a blue shift. As demonstrated in FIG. 5, the optical transmittance as a function of wavelength, it is clearly that the optical transmittance encounters a slight blue shift after laser crystallization. The relatively decreased transmittance in near-infrared range (700-1200 nm) indicates free carrier absorption, which is in good agreement with moderate carrier concentration increase in Table 1. It should be noted that, the transmittance of current series of samples were all measured with glass substrate, which still achieve around 90% transmittance in visible range. The high optical transparency and simultaneous low sheet resistance of the laser crystallized GZO film imply a significantly improved overall optoelectronic property. Electron mobility vs. free electron concentration data for GZO thin films deposited by several high vacuum methods from prior research by twelve groups was studied. These prior advancements have achieved highest electrical conductivity on different substrates (polymer, glass and sapphire), which provide a comparison with our results based on laser crystallization. Comparing PLD and followed laser crystallization method in our work with other groups the Laser crystallized GZO films exhibit high mobility (22 cm$^2$V$^{-1}$ s$^{-1}$), implying diminishing grain boundary barrier and decreasing grain boundary density. The highest electrical conductivity of current series of sample achieves over 3000 S/cm, which performs better than almost all the prior vacuum methods. Additionally, grain boundary density also could be affected by film thickness and crystal growth method which would further influence the carrier mobility. And according to equation (6), the grain boundary density influences the grain boundary mobility with a linear factor.

This supply an explanation that charge mobility in our study is still lower than some high vacuum fabrications. However, considering the 160 nm thick top layer in our work is thinner than prior advancements, our laser crystallization has potential to achieve even higher carrier mobility.

Thus this disclosure describes the method of PLD and followed by Laser crystallization was explored to deposited transparent and conductive GZO films onto glass substrate. This laser induced crystallization technique is able to apply ultra-fast post heat treatment (in several micro-seconds) to modify GZO films with better structural and optoelectronics properties, suggesting a potential for large-scale manufacturing. Multiphysics simulation model coupled laser-mater interaction and heat transfer was utilized to study pulse laser heating and heat dissipation process. The optimally crystallized GZO film exhibits low resistivity of ~$3.2\times10^{-4}$ Ω-cm, high Hall mobility of 22 cm2/Vs, and low sheet resistance of 22 Ω/sq. The high transmittance (T) over 90% @550 nm is obtained (with glass substrate). The optoelectronic performance improved mainly attributes to the polycrystalline film grain boundary modification by UV Laser such as grain boundary density decrease and the grain boundary electron traps passivation, as demonstrated by material characterization results. The ultra-fast and flexible laser treatments have the potential to apply in other metal oxides and other deposition methods, such as sol-gel, printing, and spray-coating.

It should be stressed that in this disclosure Transparent and conductive Gallium doped Zinc Oxide (GZO) films were deposited by pulsed laser deposition and followed by Laser crystallization. This laser induced crystallization technique is able to apply ultra-fast post treatment to modify GZO films with better structural and optoelectronics properties, suggesting a potential for large-scale manufacturing. A physical simulation model coupled laser-mater interaction and heat-transfer was utilized to study pulse laser heating and heat dissipation process. The laser crystallized GZO film exhibits low resistivity of ~$3.2\times10^{-4}$ Ω-cm, high Hall mobility of 22 cm$^2$/Vs, and low sheet resistance of 22 Ω/sq. The high transmittance (T) over 90% @550 nm is obtained (with glass substrate). The optoelectronic performance improved mainly attributes to the polycrystalline film grain boundary modification by UV Laser such as grain boundary density decrease and the grain boundary trap density passivation.

Based on the above description, it is an objective of this disclosure to describe a method of producing gallium-doped zinc oxide films with enhanced conductivity. The method includes the steps of depositing a gallium-doped zinc oxide film on a substrate using a pulsed laser deposition technique, and subjecting the deposited gallium-dope zinc oxide film to a post-treatment capable of resulting in recrystallization of the deposited gallium-doped zinc oxide film, wherein the recrystallization results in a gallium-doped zinc oxide film with a conductivity higher than the conductivity of the gallium-doped zinc oxide film deposited on the substrate pulsed laser deposition technique. Examples of substrates suitable for the method of this disclosure include but not limited to quartz, silicon, and sapphire.

Based on the above description, it is another objective of this disclosure to describe a method of producing gallium-doped zinc oxide films with enhanced conductivity. The method includes the steps of depositing a gallium-doped zinc oxide film on a substrate using a pulsed laser deposition technique, and subjecting the deposited gallium-dope zinc oxide film to a ultraviolet laser beam resulting in recrystallization of the deposited gallium-doped zinc oxide film, wherein the recrystallization results in a gallium-doped zinc oxide film with a conductivity higher than the conductivity of the gallium-doped zinc oxide film deposited on the substrate pulsed laser deposition technique. Examples of substrates suitable for the method of this disclosure include but not limited to quartz, silicon, and sapphire.

It is also an objective of this disclosure to describe a film comprising gallium-doped zinc oxide wherein the film contains a recrystallized grain structure on its surface. In some embodiments of the film, the film exhibits Hall mobility in the range of 20-30 cm$^2$ V$^{-1}$ s$^{-1}$. In some embodiments of the film, the film has a sheet resistance in the range of 15-25 ohms/square. In certain embodiments of the film, the film has a surface roughness in the range of 0.9-2.5 nm. In some embodiments of the film, film has a transmittance of 80%-90% in the visible light frequency range. It is possible to achieve transmittance higher than 90% for visible light by fine tuning the processing conditions of the method described above and by optimizing the recrystallization structure which includes grain size and surface roughness.

While the present disclosure has been described with reference to certain embodiments, it will be apparent to those of ordinary skill in the art that other embodiments and implementations are possible that are within the scope of the present disclosure without departing from the spirit and scope of the present disclosure. Thus, the implementations should not be limited to the particular limitations described. Other implementations may be possible. It is therefore intended that the foregoing detailed description be regarded as illustrative rather than limiting. Thus, this disclosure is limited only by the following claims.

The invention claimed is:

1. A film comprising recrystallized gallium-doped zinc oxide:
    wherein the film is formed by subjecting a gallium-doped zinc oxide film deposited by pulsed laser deposition technique to 10 to 50 pulses of ultraviolet laser beam,
    wherein the film contains a recrystallized grain structure on its surface, wherein grains of the recrystallized grain structure of the film contain nanoparticles and exhibit textured crystal orientation, and wherein grain boundaries between the nanoparticles of the grains are faceted, and
    wherein the film has a surface roughness in the range of 0.9-2.5 nm.

2. The film of claim 1, wherein the film exhibits Hall mobility in the range of 20-30 cm$^2$ V$^{-1}$ s$^{-1}$.

3. The film of claim 1, wherein the film has a sheet resistance in the range of 15-25 ohms/square.

4. The film of claim 1, wherein the film has a transmittance of 80%-90% in the visible frequency range.

* * * * *